United States Patent
Lai et al.

(10) Patent No.: US 8,778,743 B2
(45) Date of Patent: Jul. 15, 2014

(54) LATCH-UP ROBUST PNP-TRIGGERED SCR-BASED DEVICES

(75) Inventors: Da-Wei Lai, Singapore (SG); Mahadeva Iyer Natarajan, Clifton Park, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 64 days.

(21) Appl. No.: 13/588,014

(22) Filed: Aug. 17, 2012

(65) Prior Publication Data

US 2014/0049313 A1    Feb. 20, 2014

(51) Int. Cl.
*H01L 21/332*    (2006.01)
*H01L 23/62*    (2006.01)

(52) U.S. Cl.
USPC ............. 438/135; 257/173; 257/355

(58) Field of Classification Search
None
See application file for complete search history.

(56) References Cited

U.S. PATENT DOCUMENTS

| 2002/0081783 A1* | 6/2002 | Lee et al. ............ 438/133 |
| 2007/0034956 A1* | 2/2007 | Lee et al. ............ 257/355 |
| 2007/0120191 A1* | 5/2007 | Litfin .................. 257/355 |

* cited by examiner

*Primary Examiner* — Julio J Maldonado
*Assistant Examiner* — Joseph Galvin, III
(74) *Attorney, Agent, or Firm* — Ditthavong & Steiner, P.C.

(57) ABSTRACT

An approach for providing a latch-up robust PNP-triggered SCR-based device is disclosed. Embodiments include providing a silicon control rectifier (SCR) region; providing a PNP region having a first n-well region proximate the SCR region, a first N+ region and a first P+ region in the first n-well region, and a second P+ region between the SCR region and the first n-well region; coupling the first N+ region and the first P+ region to a power rail; and coupling the second P+ region to a ground rail.

20 Claims, 6 Drawing Sheets

LATCH-UP ROBUST PNP-TRIGGERED SCR-BASED DEVICES

TECHNICAL FIELD

The present disclosure relates to silicon control rectifier (SCR) devices. The present disclosure is particularly applicable to PNP-triggered SCR-based devices.

BACKGROUND

FIG. 1 schematically illustrates a traditional SCR-based electrostatic discharge (ESD) protection device. As shown, the device in FIG. 1 includes substrate 101 with p-well region 103 and n-well region 105, and shallow trench isolation (STI) region 107 between well regions 103 and 105. As depicted, p-well region 103 includes P+ region 109 and N+ region 111 coupled to ground rail 113 (e.g., VSS), and n-well region 105 includes P+ region 115 and N+ region 117 coupled to I/O pad 119. In general, SCR-based ESD protection devices provide robust ESD performance and compact size. However, typical SCR-based ESD protection devices suffer from latch-up issues, particularly for high voltage processes. For example, an ESD event (e.g., from I/O pad 119 to ground rail 113) may induce reverse breakdown with respect to n-well region 105 and substrate 101. If there is enough charge to maintain parasitic PNP and NPN structures, latch-up path 121 may occur, causing disruptions with regard to proper functioning of a circuit (e.g., that the SCR-based device is supposed to protect) or even destruction of the circuit due to excess current.

FIG. 2 schematically illustrates characteristics of a traditional SCR-based ESD protection device under an ESD condition. As shown, in diagram 201, once the trigger voltage ($V_t$) is reached, the SCR-based ESD protection device will snapback to the holding voltage ($V_h$) (e.g., for maintaining the parasitic PNP and NPN structures). In addition, as depicted, a traditional SCR-based ESD protection device has a high trigger voltage (e.g., $V_{t1}$~10 volts (V) for logic process), a low trigger current (e.g., $I_{t1}$~a milliamp (mA)), and a low holding voltage (e.g., $V_h$ 18 2 V). Consequently, a traditional SCR-based ESD protection device fails to adequately provide protection from latch-up events (e.g., transient ESD-induced latch-ups, static latch-up testing, etc.). Although latch-up issues may be reduced by increasing the p-n junction space of the SCR and cascading the SCR to increase the holding voltage ($V_h$) of the SCR, such an approach consumes substantially more device/chip area, resulting in the need for larger device/chip size.

A need therefore exists for an efficient latch-up robust PNP-triggered SCR-based device, and enabling methodology.

SUMMARY

An aspect of the present disclosure is a method for implementing a latch-up robust PNP-triggered SCR-based device.

Another aspect of the present disclosure is a latch-up robust PNP-triggered SCR-based device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a SCR region; providing a PNP region having a first n-well region proximate the SCR region, a first N+ region and a first P+ region in the first n-well region, and a second P+ region between the SCR region and the first n-well region; coupling the first N+ region and the first P+ region to a power rail; and coupling the second P+ region to a ground rail.

Another aspect includes preventing latch mode of the SCR region until a pre-designated trigger threshold is satisfied by providing a first ESD current path from the power rail to the ground rail through the first n-well region of the PNP region. Additional aspects include: providing the SCR region having a second n-well region, a second N+ region and a third P+ region in the second n-well region, and a third N+ region and a fourth P+ region between the second n-well region and the second P+ region; coupling the second N+ region and the third P+ region to the power rail; and coupling the third N+ region and the fourth P+ region to the ground rail. Further aspects include providing a second ESD current path from the power rail to the ground rail through the second n-well region when the pre-designated trigger threshold is satisfied. Various aspects include the pre-designated trigger threshold having a trigger current threshold of over 100 mA. Certain aspects include: providing a first distance between the third N+ region and the third P+ region; and providing a second distance, that is different from the first distance, between the first and second P+ regions. Some aspects include providing the first distance to be greater than the second distance. Other aspects include: coupling the second P+ region to the third N+ region and the fourth P+ region; and coupling the first N+ region and the first P+ region to the second N+ region and the third P+ region.

An additional aspect of the present disclosure is a device including: a SCR region; and a PNP region having a first n-well region proximate the SCR region, a first N+ region and a first P+ region in the first n-well region, and a second P+ region between the SCR region and the first n-well region, the first N+ region and the first P+ region being coupled to a power rail, and the second P+ region being coupled to a ground rail.

Another aspect includes a device having a first ESD current path from the power rail to the ground rail through the first n-well region of the PNP region, wherein the device is configured to prevent latch mode of the SCR region based on the first ESD current path until a pre-designated trigger threshold is satisfied. Additional aspects include a device having: the SCR region including a second n-well region, a second N+ region and a third P+ region in the second n-well region, and a third N+ region and a fourth P+ region between the second n-well region and the second P+ region; the second N+ region and the third P+ region being coupled to the power rail; and the third N+ region and the fourth P+ region being coupled to the ground rail.

Further aspects include a device having a second ESD current path from the power rail to the ground rail through the second n-well region when the pre-designated trigger threshold is satisfied. Some aspects include the pre-designated trigger threshold having a trigger current threshold of over 100 mA. Certain aspects include the third N+ region and the third P+ region being separated by a first distance, and the first and second P+ regions being separated by a second distance different from the first distance. Various aspects include the first distance being greater than the second distance. Other aspects include the second P+ region being coupled to the third N+ region and the fourth P+ region, and the first N+ region and the first P+ region being coupled to the second N+ region and the third P+ region.

Another aspect of the present disclosure is a method including: providing a SCR region in a substrate; providing a PNP region having a first high voltage n-type double diffused (HVNDD) region proximate the SCR region, a first N+ region and a first P+ region in the first HVNDD region, and a second P+ region between the SCR region and the first HVNDD region; and preventing latch mode of the SCR region until a pre-designated trigger current threshold is satisfied by providing a first ESD current path from a power rail to a ground rail through the first HVNDD region.

Further aspects include the pre-designated trigger threshold having a trigger current threshold of over 100 mA. Some aspects include: providing the SCR region having a second HVNDD region, a second N+ region and a third P+ region in the second HVNDD region, and a third N+ region and a fourth P+ region between the second HVNDD region and the second P+ region; coupling the first N+ region, the second N+ region, the first P+ region, and the third P+ region to the power rail; and coupling the third N+ region, the second P+ region, and the fourth P+ region to the ground rail. Other aspects include: providing a first distance between the third N+ region and the third P+ region; and providing a second distance, that is less than the first distance, between the first and second P+ regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of latch-up in a SCR-based device attendant upon an ESD event. The present disclosure addresses and solves such problems, for instance, by, inter alia, providing a PNP region having a first n-well region proximate a SCR region, a first N+ region and a first P+ region in the first n-well region, and a second P+ region between the SCR region and the first n-well region.

Figure 1:
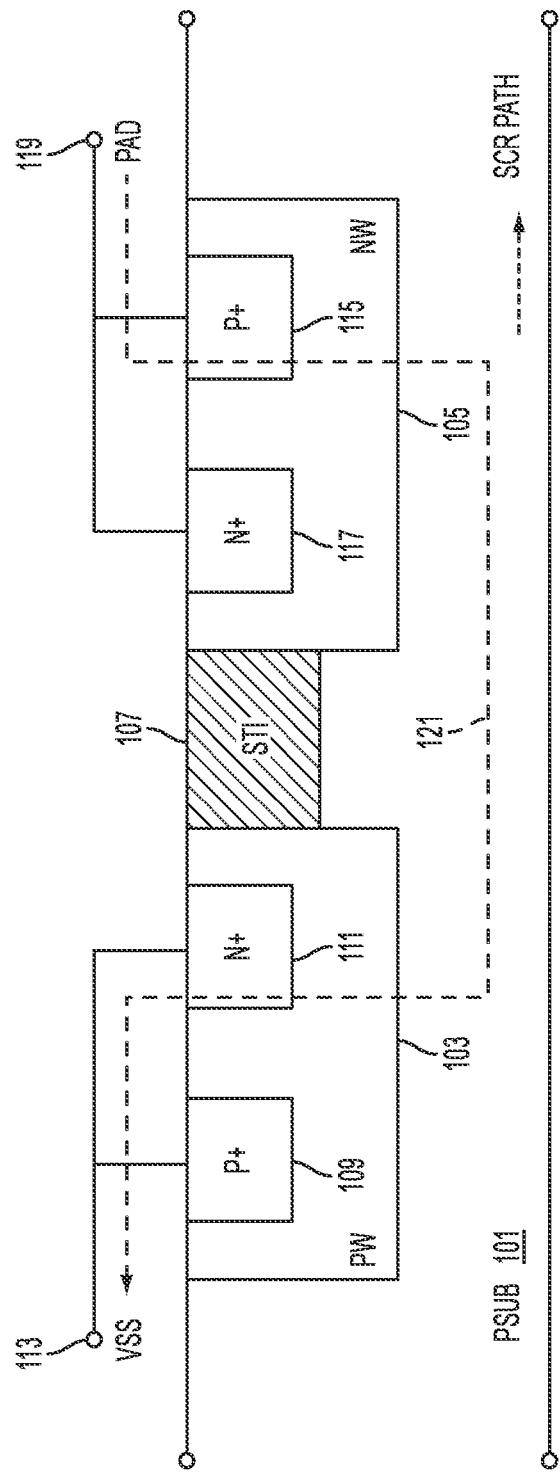
FIG. 1 schematically illustrates a traditional SCR-based ESD protection device.
Figure 2:
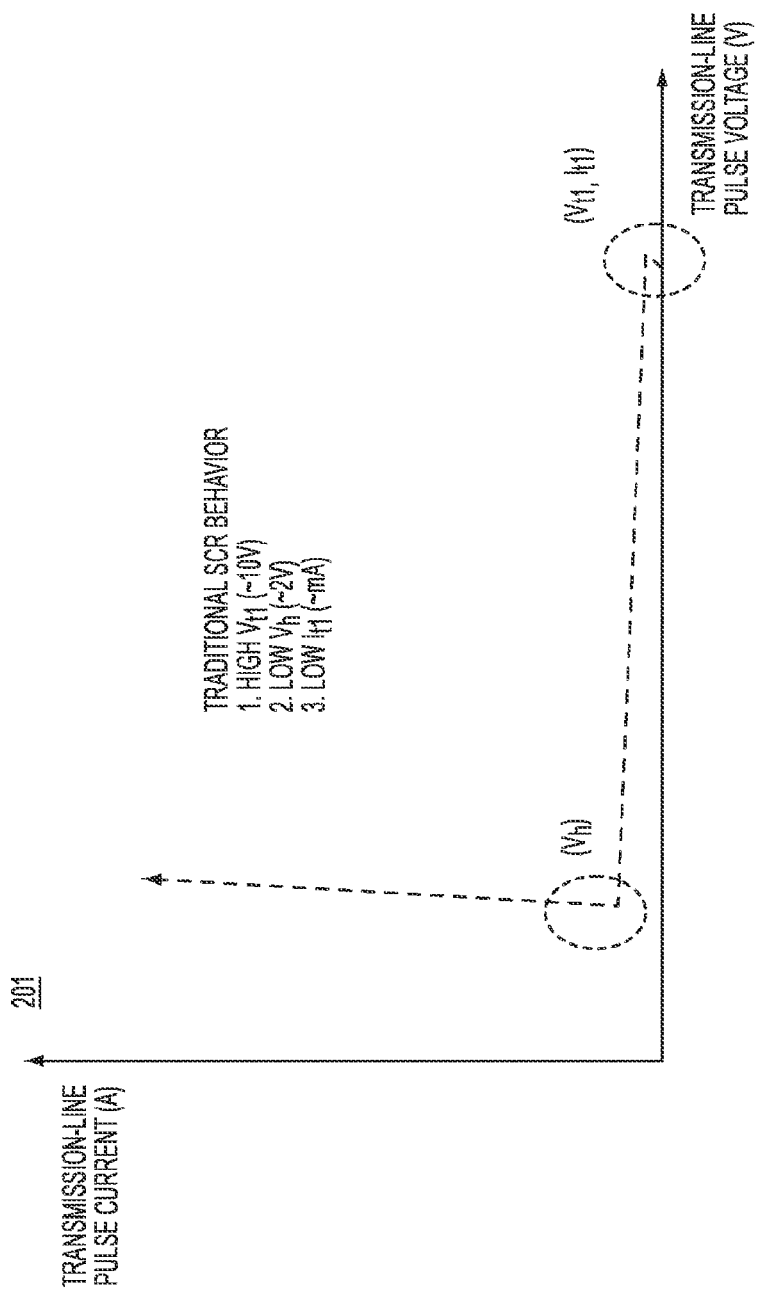
FIG. 2 schematically illustrates characteristics of a traditional SCR-based ESD protection device under an ESD condition.
Figures 3A, 3B:
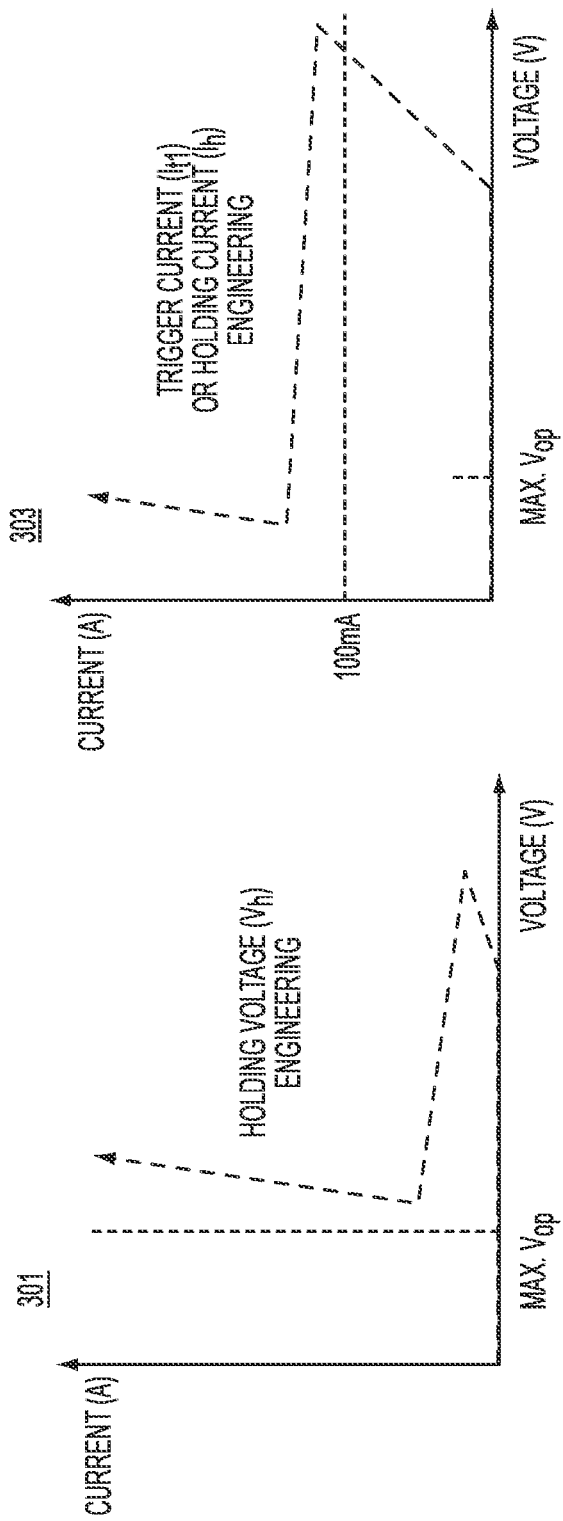
FIGS. 3A and 3B schematically illustrate concepts to overcome latch-up issues.

FIGS. 3A and 3B schematically illustrate concepts to overcome latch-up issues. For example, according to latch-up specifications, latch-up risk may be eliminated if the holding voltage ($V_h$) of an SCR is greater than the maximum operating voltage (max. $V_{op}$) (e.g., diagram 301 of FIG. 3A). However, for high voltage processes, this approach encounters strong snapback behavior. Moreover, latch-up issues may be overcome by setting the trigger current ($I_t$) or the holding current ($I_h$) of the SCR to be greater than 100 mA (e.g., diagram 303 of FIG. 3B).

Figure 4:
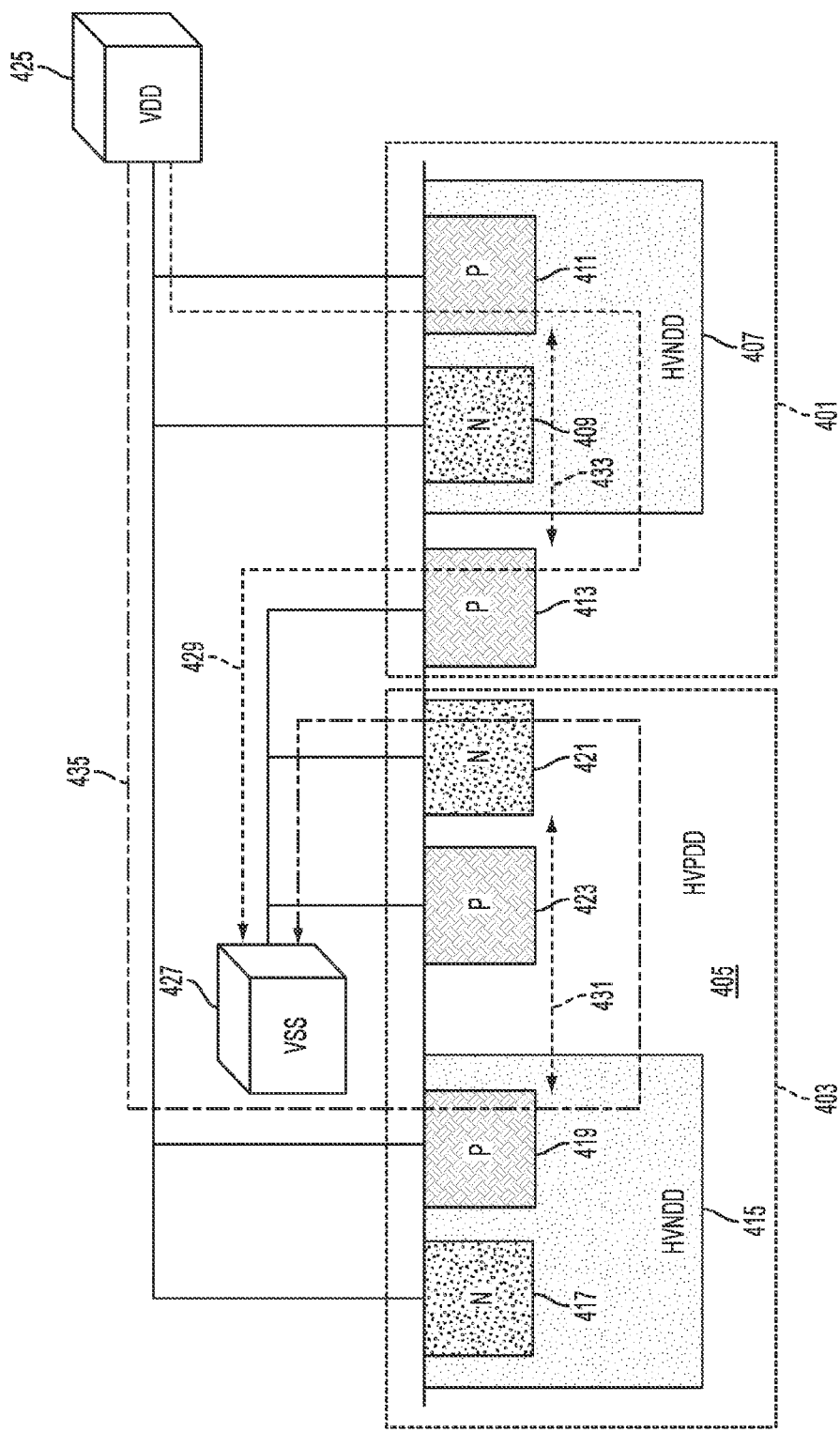
FIG. 4 schematically illustrates a latch-up robust PNP-triggered SCR-based device, in accordance with an exemplary embodiment of the present disclosure.

FIG. 4 schematically illustrates a latch-up robust PNP-triggered SCR-based device, in accordance with an exemplary embodiment of the present disclosure. As shown, the structure in FIG. 4 includes PNP region 401 and SCR region 403 in a substrate (or in high voltage p-type double diffused (HVPDD) region 405). PNP region 401 includes HVNDD region 407, N+ region 409 and P+ region 411 in HVNDD region 407, and P+ region 413 between SCR region 403 and HVNDD region 407. SCR region 403 includes HVNDD region 415, N+ region 417 and P+ region 419 in HVNDD region 415, and N+ region 421 and P+ region 423 between HVNDD region 415 and P+ region 413.

Moreover, regions 409, 411, 417, and 419 are coupled to power rail 425, while regions 413, 421, and 423 are coupled to ground rail 427. Based on the coupling, current path 429 may exist to enable current (e.g., ESD current) flow from power rail 425 to ground rail 427 through HVNDD region 407 and P+ region 413, for instance, to prevent latch mode of SCR region 403 until a pre-designated trigger threshold is reached (e.g., a trigger current threshold of over 100 mA). For example, the pre-designated trigger threshold may be a trigger current threshold of 230 mA that is set based on well-designed parameters 431 and 433, where parameter 431 may indicate the distance between P+ region 419 and N+ region 421, and parameter 433 may indicate the distance between P+ regions 411 and 413. As depicted, the distance associated with parameter 431 may be greater than the distance associated with parameter 433.

Although SCR region 403 may initially conduct some current, latch-up mode of SCR region 403 is prevented until the pre-designated trigger threshold is reached since most of the current will flow through current path 429. However, when the pre-designated trigger threshold is reached, SCR current path 435 may be triggered to enable a rapid switch of SCR region 403 into latch mode (e.g., fully turned-on), allowing the structure of FIG. 4 to avoid latch-up issues associated with traditional SCR-based ESD protection devices. In addition, because the structure of FIG. 4 may be implemented without requiring increasing the p-n junction space of SCR region 403 or cascading SCR region 403, latch-up robustness for SCR-based devices may be achieved with minimal impact on device size and chip area.

Figure 5A:
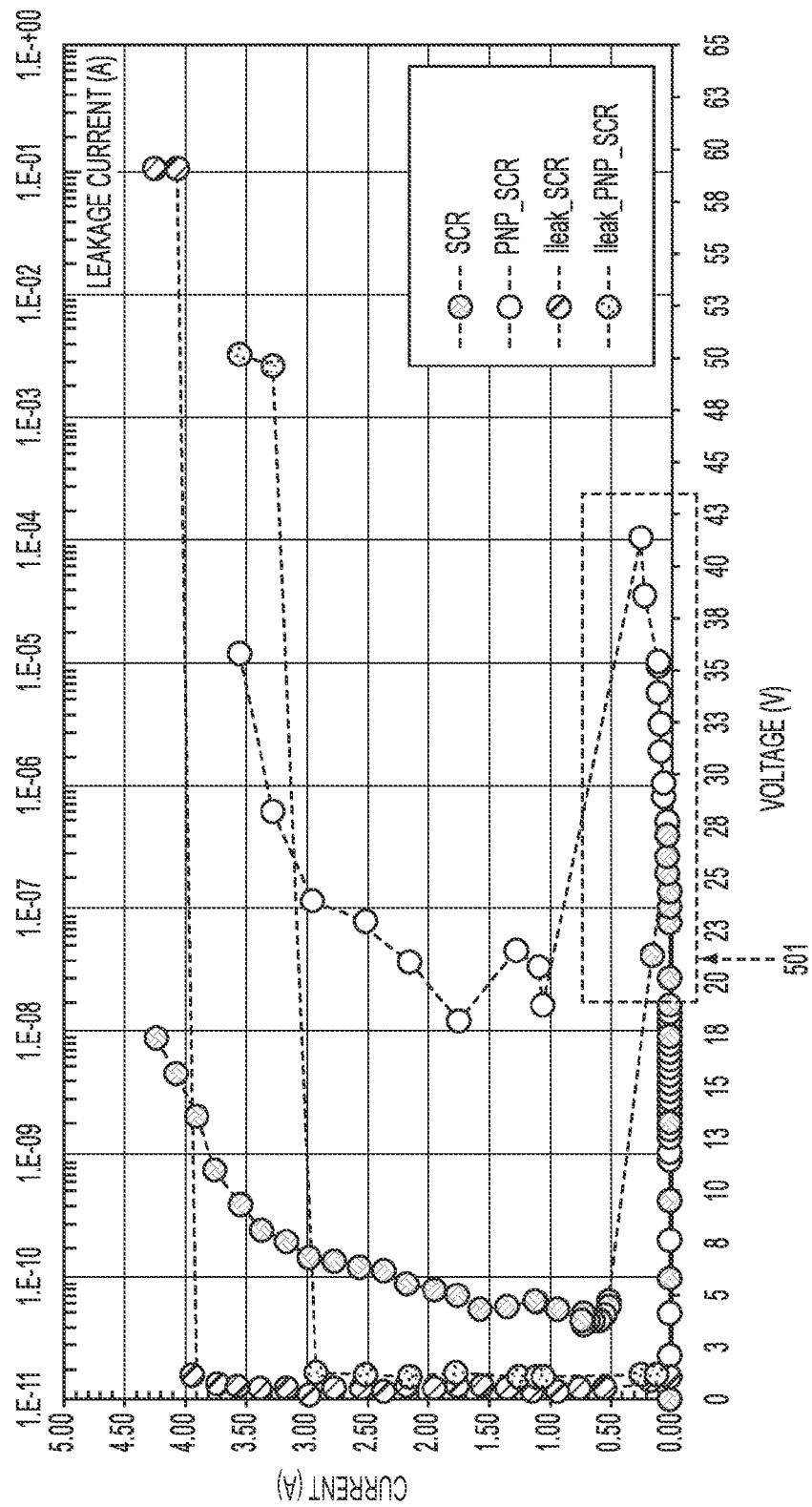
FIGS. 5A and 5B schematically illustrate characteristics of a latch-up robust PNP-triggered SCR-based device, in accordance with an exemplary embodiment of the present disclosure.
Figure 5B:
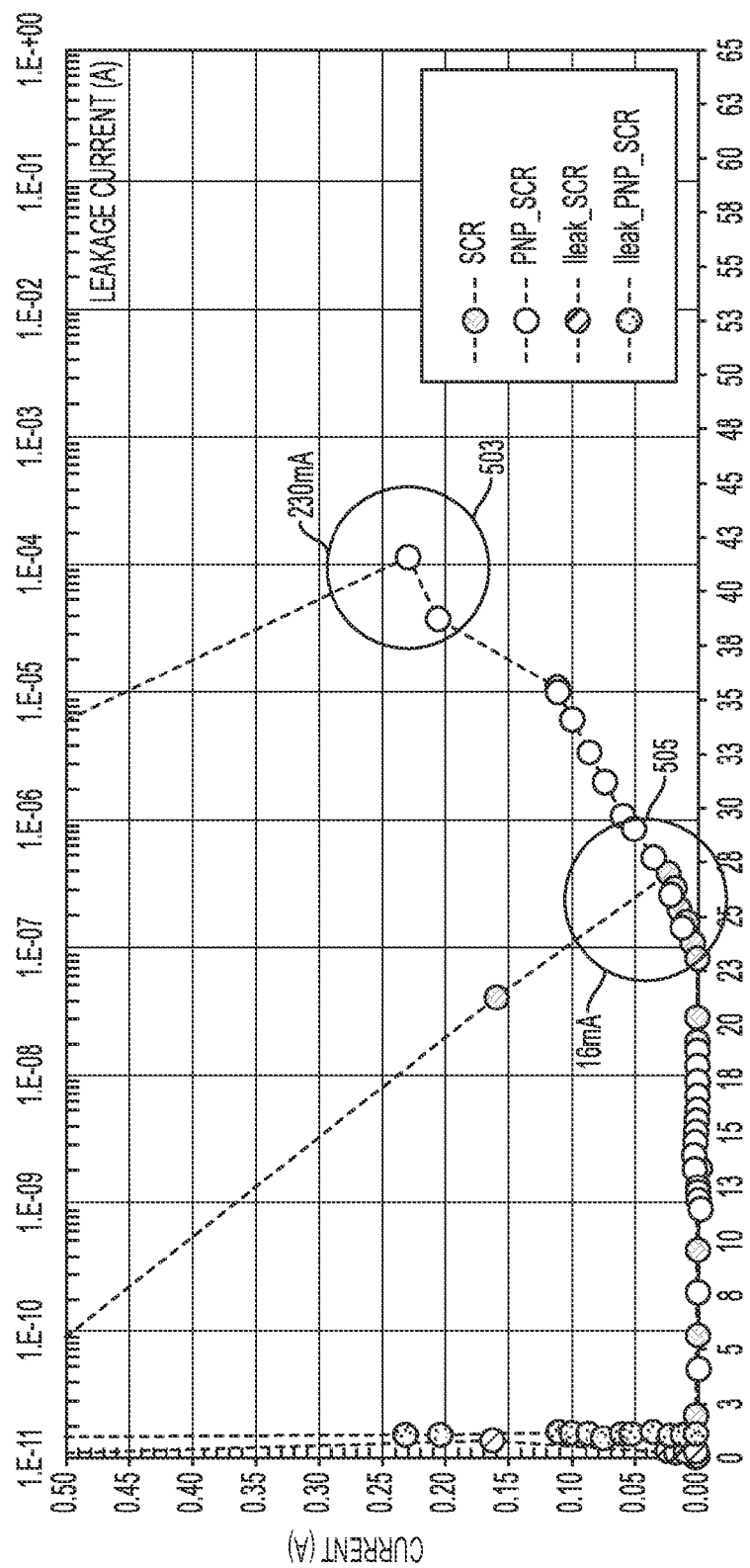

FIGS. 5A and 5B schematically illustrate characteristics of a latch-up robust PNP-triggered SCR-based device, in accordance with an exemplary embodiment of the present disclosure. Specifically, FIG. 5A provides a graph demonstrating certain characteristics of a latch-robust PNP-triggered SCR-based device according to an aspect of the present disclosure (e.g., the structure of FIG. 4), while FIG. 5B provides a graph representing a subset of the graph in FIG. 5A (e.g., indicator 501). As shown in FIG. 5A, the structure in FIG. 4 may exhibit robust ESD performance with a device fail point of around 3 A. Moreover, as depicted in FIG. 5B, the structure in FIG. 4 may have a high pre-designated trigger current threshold (e.g., based on its design) of 230 mA (e.g., indicator 503), as compared with a typical SCR having a trigger current threshold of 16 mA (e.g., indicator 505).

The embodiments of the present disclosure can achieve several technical effects, including latch-up robustness for SCR-based devices with minimal impact on device size and chip area. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or any other devices utilizing logic or high-voltage technology nodes. The present disclosure therefore enjoys industrial applicability in any of various types of highly integrated semiconductor devices, including devices that use ESD protection devices to pass ESD/latch-up standards specifications (e.g., liquid crystal display (LCD) drivers, synchronous random access memories (SRAM), One Time Programming (OTP), and power management products).

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a silicon control rectifier (SCR) region;
providing a PNP region proximate the SCR region and having a first n-well region, a first N+ region and a first P+ region in the first n-well region, and a second P+ region between the SCR region and the first n-well region, wherein the first N+ region is located between the first P+ region and the second P+ region;
coupling the first N+ region and the first P+ region to a power rail; and
coupling the second P+ region to a ground rail.

2. The method according to claim 1, further comprising:
preventing latch mode of the SCR region until a pre-designated trigger threshold is satisfied by providing a first ESD current path from the power rail to the ground rail through the first n-well region of the PNP region.

3. The method according to claim 2, further comprising:
providing the SCR region having a second n-well region, a second N+ region and a third P+ region in the second n-well region, and a third N+ region and a fourth P+ region between the second n-well region and the second P+ region;
coupling the second N+ region and the third P+ region to the power rail; and
coupling the third N+ region and the fourth P+ region to the ground rail.

4. The method according to claim 3, further comprising:
providing a second ESD current path from the power rail to the ground rail through the second n-well region when the pre-designated trigger threshold is satisfied.

5. The method according to claim 3, wherein the pre-designated trigger threshold includes a trigger current threshold of over 100 milliamps (mA).

6. The method according to claim 3, further comprising:
providing a first distance between the third N+ region and the third P+ region; and
providing a second distance, that is different from the first distance, between the first and second P+ regions.

7. The method according to claim 6, further comprising:
providing the first distance to be greater than the second distance.

8. The method according to claim 3, further comprising:
coupling the second P+ region to the third N+ region and the fourth P+ region; and
coupling the first N+ region and the first P+ region to the second N+ region and the third P+ region.

9. A device comprising:
a silicon control rectifier (SCR) region; and
a PNP region proximate the SCR region and having a first n-well region, a first N+ region and a first P+ region in the first n-well region, and a second P+ region between the SCR region and the first n-well region, wherein the first N+ region is located between the first P+ region and the second P+ region the first N+ region and the first P+ region being coupled to a power rail, and the second P+ region being coupled to a ground rail.

10. The device according to claim 9, further comprising:
a first ESD current path from the power rail to the ground rail through the first n-well region of the PNP region, wherein the device is configured to prevent latch mode of the SCR region based on the first ESD current path until a pre-designated trigger threshold is satisfied.

11. The device according to claim 10, wherein the SCR region includes a second n-well region, a second N+ region and a third P+ region in the second n-well region, and a third N+ region and a fourth P+ region between the second n-well region and the second P+ region, and wherein the second N+ region and the third P+ region is coupled to the power rail, and the third N+ region and the fourth P+ region is coupled to the ground rail.

12. The device according to claim 11, further comprising:
a second ESD current path from the power rail to the ground rail through the second n-well region when the pre-designated trigger threshold is satisfied.

13. The device according to claim 11, wherein the pre-designated trigger threshold includes a trigger current threshold of over 100 milliamps (mA).

14. The device according to claim 11, wherein the third N+ region and the third P+ region are separated by a first distance, and the first and second P+ regions are separated by a second distance different from the first distance.

15. The device according to claim 14, wherein the first distance is greater than the second distance.

16. The device according to claim 11, wherein the second P+ region is coupled to the third N+ region and the fourth P+ region, and the first N+ region and the first P+ region is coupled to the second N+ region and the third P+ region.

17. A method comprising:
providing a silicon control rectifier (SCR) region in a substrate;
providing a PNP region proximate the SCR region and having a first high voltage n-type double diffused (HVNDD) region, a first N+ region and a first P+ region in the first HVNDD region, and a second P+ region between the SCR region and the first HVNDD region, wherein the first N+ region is located between the first P+ region and the second P+ region; and preventing latch mode of the SCR region until a pre-designated trigger current threshold is satisfied by providing a first ESD current path from a power rail to a ground rail through the first HVNDD region.

18. The method according to claim 17, wherein the pre-designated trigger threshold includes a trigger current threshold of over 100 milliamps (mA).

19. The method according to claim 17, further comprising:
providing the SCR region having a second HVNDD region, a second N+ region and a third P+ region in the second HVNDD region, and a third N+ region and a fourth P+ region between the second HVNDD region and the second P+ region;

coupling the first N+ region, the second N+ region, the first P+ region, and the third P+ region to the power rail; and coupling the third N+ region, the second P+ region, and the fourth P+ region to the ground rail.

20. The method according to claim 19, further comprising:
providing a first distance between the third N+ region and the third P+ region; and providing a second distance, that is less than the first distance, between the first and second P+ regions.

* * * * *